(12) United States Patent
Lindemann

(10) Patent No.: US 10,020,783 B2
(45) Date of Patent: Jul. 10, 2018

(54) CLASS D AMPLIFIER USING FS/4 MODULATION AND ENVELOPE TRACKING POWER SUPPLIES

(71) Applicant: Broadcast Electronics, Inc., Quincy, IL (US)

(72) Inventor: Brian Lindemann, Quincy, IL (US)

(73) Assignee: BEI Electronics LLC, Quincy, IL (US)

( * ) Notice: Subject to any disclaimer, the term of this patent is extended or adjusted under 35 U.S.C. 154(b) by 0 days.

(21) Appl. No.: 15/201,334

(22) Filed: Jul. 1, 2016

(65) Prior Publication Data

US 2017/0133991 A1 May 11, 2017

Related U.S. Application Data

(60) Provisional application No. 62/187,775, filed on Jul. 1, 2015.

(51) Int. Cl.
| | |
|---|---|
| *H04B 1/38* | (2015.01) |
| *H03F 3/19* | (2006.01) |
| *H03F 3/217* | (2006.01) |
| *H04B 1/00* | (2006.01) |
| *H04B 1/40* | (2015.01) |
| *H04L 27/00* | (2006.01) |

(52) U.S. Cl.
CPC ............ *H03F 3/19* (2013.01); *H03F 3/2171* (2013.01); *H03F 3/2173* (2013.01); *H03F 2200/102* (2013.01); *H03F 2200/336* (2013.01); *H03F 2200/451* (2013.01); *H04B 1/00* (2013.01); *H04B 1/40* (2013.01); *H04L 27/0008* (2013.01)

(58) Field of Classification Search
CPC .......... H04L 27/0008; H04B 1/00; H04B 1/40

USPC .................................................. 375/219, 295
See application file for complete search history.

(56) References Cited

U.S. PATENT DOCUMENTS

| | | | |
|---|---|---|---|
| 6,614,323 | B2 | 9/2003 | Wagh et al. |
| 7,092,269 | B1 | 8/2006 | Westberg |
| 7,130,346 | B2 | 10/2006 | Midya et al. |
| 7,142,597 | B2 | 11/2006 | Midya et al. |
| 7,227,487 | B1 | 6/2007 | Midya et al. |
| 7,649,961 | B2 | 1/2010 | Midya |
| 7,677,552 | B2 | 3/2010 | Hugues et al. |
| 7,724,837 | B2 | 5/2010 | Filimonov et al. |
| 7,777,563 | B2 | 8/2010 | Midya et al. |

(Continued)

OTHER PUBLICATIONS

Allan Herriman; "DSP Trick: Complex Downconverters for Signals at Fs/4 or 3Fs/4"; article; Apr. 22, 1999; pp. 1-3; https://dspguru.com/dsp/tricks/complex-downconverters-at-fs-over-4/ ; dspGuru; Iowegian International Corp., 11223 W 99th Pl, Overland Park, KS 66214; USA.

(Continued)

*Primary Examiner* — Leila Malek
(74) *Attorney, Agent, or Firm* — Brevetto Law Group

(57) ABSTRACT

A high power class D amplifier/modulator for use in Radio Frequency ranges that is capable of digital modulation schemes at high efficiencies is disclosed. The new amplifier design features an envelope tracker unit that uses digital pulse-width modulation (PWM) generation to create analog I and Q phase high voltage signal components and sign bits. The I and Q phase signal components and sign bits are fed into an Fs/4 modulator stage to produce an analog output that is an high power RF signal modulated by the analog input signal.

15 Claims, 4 Drawing Sheets

(56) References Cited

U.S. PATENT DOCUMENTS

| | | |
|---|---|---|
| 7,825,726 B2 | 11/2010 | Midya |
| 7,839,231 B1 | 11/2010 | Groe et al. |
| 7,999,629 B2 | 8/2011 | Gossmann |
| 8,068,540 B2 | 11/2011 | De Jong et al. |
| 8,988,049 B2 | 3/2015 | Midya |
| 9,685,982 B2 | 6/2017 | Zhu et al. |
| 9,806,673 B2 | 10/2017 | Banerjee et al. |
| 2007/0239001 A1 | 10/2007 | Mehi et al. |
| 2009/0225903 A1* | 9/2009 | van Waasen ............ H03C 3/40 375/316 |
| 2010/0075615 A1 | 3/2010 | Ma |
| 2012/0038998 A1 | 2/2012 | Mathew et al. |

OTHER PUBLICATIONS

Jonathan Harris; "What's Up With Digital Downconverters—Part 1"; article; Jul. 1, 2016; pp. 1-7; http://www.analog.com/media/en/analog-dialogue/volume-50/number-3/articles/whats-up-with-digital-downconverters-part-1.pdf ; Analog Devices, Inc., Norwood, MA, 02062; USA.

Richard G. Lyons; "Digital Signal Processing Tricks—Frequency Translation without multiplication"; article; Sep. 24, 2007; p. 1-7; https://www.embedded.com/print/4007186; Embedded.com, 1225 Franklin Ave., Suite 400 Garden City, NY 11530; USA.

\* cited by examiner

US 10,020,783 B2

CLASS D AMPLIFIER USING FS/4 MODULATION AND ENVELOPE TRACKING POWER SUPPLIES

CROSS-REFERENCE TO RELATED APPLICATIONS

The present application claims priority from, and incorporates by reference in its entirety, Provisional U.S. patent application Ser. No. 62/187,775 filed Jul. 1, 2015.

BACKGROUND

Technical Field

The present subject matter relates to circuitry for radio transmission, and more specifically, to a new design for a class-D amplifier and modulator.

Description of Related Art

FIG. 1 depicts a simplified circuit design of a conventional Class D amplifier. In a Class D amplifier, sometimes called a switching amplifier, the amplifying components—e.g., MOSFET transistors—operate as electronic switches rather than as linear gain devices, a typical use of MOSFETs. Conventional Class D amplifiers modulate the final power stage using a binary signal, typically pulse width modulation. This power stage transistor operates in an efficient manner because it is either fully on (saturated) or off (cutoff). As such, Class D amplifiers have been able to enjoy fairly good efficiencies.

However, because the transistor is operating fully saturated or cutoff, the frequency of operation of such a system is limited by the transistor switching speed. Class D amplification for audio frequencies (20 Hz to 20 kHz) are now ubiquitous. However, conventional Class D amplification for Radio Frequencies have been limited in the past to AM band (500 to 1700 kHz). Broadcast Electronics' 4MX AM Transmitter is an embodiment of a Class D amplifier in the AM band, as described in U.S. Pat. No. 7,092,269.

SUMMARY

The inventor recognized the bandwidth limitation problem of conventional Class D amplifiers. The present application addresses this problem. This application includes disclosure of a class D amplifier using Fs/4 modulation and envelope tracking power supplies. In some embodiments the amplifier includes a digital I/O generator that has an input port for receiving an analog input signal. The digital I/O generator produces a digital signal at an output port. In various embodiments this signal is a constant 25% duty cycle and not subject to the constraints of pulse width modulation at a high frequency.

The amplifier also includes an envelope tracker connected to the output port of the digital I/O generator. The envelope tracker frequency modulates the digital signal from the digital I/O generator to produce an output of an analog In-phase ("I") voltage, an analog Quadrature-phase ("Q") voltage, and sign bits for the I voltage and the Q voltage. The inclusion of the sign bit aids in preventing this voltage from being negative. The sign bit causes the phase of the digital signals to the switching transistors to be changed, thus effectively replicating the same as would have resulted had the analog I or Q voltage been negative while the switching phase remained constant.

The amplifier has an Fs/4 modulator stage that includes an Fs/4 I modulator configured to receive the analog I voltage and the sign bits for the I voltage. The Fs/4 modulator stage also has an Fs/4 Q modulator configured to receive the analog Q voltage and the sign bits for the Q voltage. Finally, the amplifier has a combiner configured to sum the Fs/4 I modulator output and the Fs/4 Q modulator output to produce an analog output that is a modulated and amplified version of the analog input signal.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. They should not, however, be taken to limit the invention to the specific embodiment(s) described, but are for explanation and understanding only. In the drawings.

DETAILED DESCRIPTION

Figure 1:
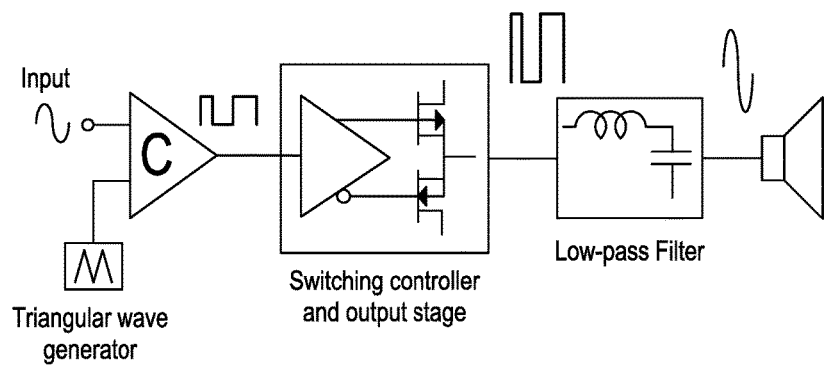
FIG. 1 depicts a simplified circuit design of a conventional Class D amplifier.
Figure 2:
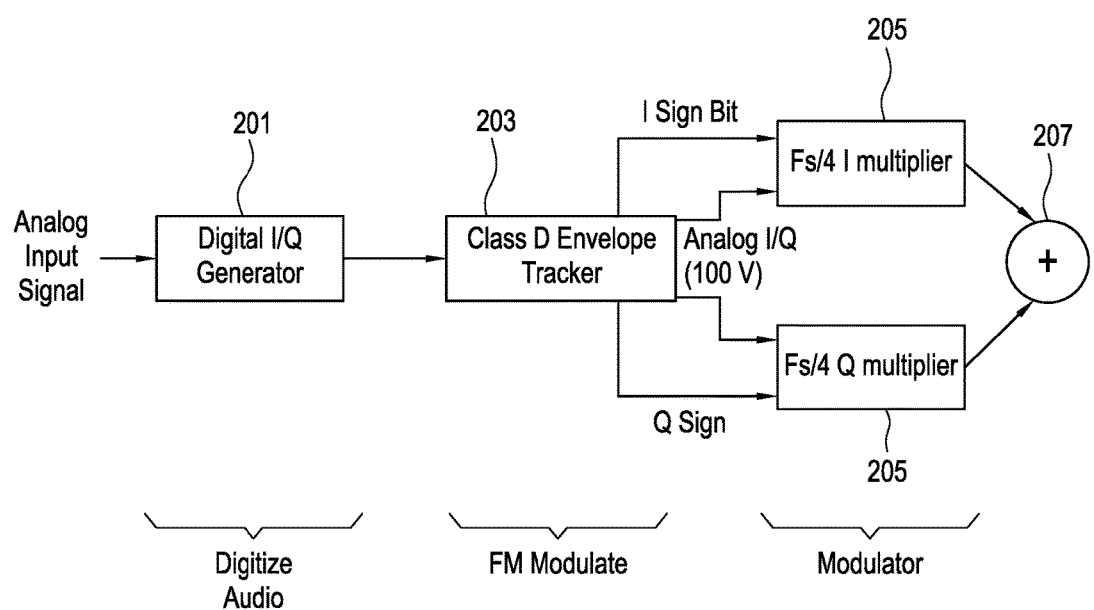
FIG. 2 shows a block diagram of a Class D amplifier using Fs/4 modulation and envelope tracking power supplies according to various embodiments disclosed herein.

FIG. 2 shows a block diagram of an embodiment of a Class D amplifier using Fs/4 modulation and envelope tracking power supplies. Various embodiments disclosed herein address the bandwidth limitation of the RF devices by using a pair of Class D power supplies to convert the hybrid alternating current (AC) mains input to on-board direct current (DC). The DC to Radio Frequency (RE) conversion may be performed using Fs/4 selective outputs. For an FM band signal (e.g., 88 MHz to 108 MHz carrier frequency), various embodiments disclosed herein may provide 200 MHz of bandwidth out of the final output transistor, and an input of 400 kHz of bandwidth from the Class D power supply.

Various embodiments make use of an exciter capable of generating a digital signal comprising the In-Phase and Quadrature-Phase components (I and Q) of a 0 Hz centered signal (baseband.) The I and Q may represent 100 kHz bandwidth Frequency Modulated signal, or any of a multitude of digital signals including HD Radio, DRM+, DAB, or the like, with varying bandwidths up to 700 kHz. The I and Q are then separately amplified from their nominal 16-bit digital representation to a high magnitude analog signal using Class D audio amplification. These two analog signals form the power envelope which are then put on-frequency using Fs/4 modulation.

Turning again to the block diagram of FIG. 2, the Digital I/O generator block 201 is a digitizer circuit or unit that performs a digital modulation. The Digital I/O generator 201 may be embodied as, for instance, Broadcast Electronics' part number 919-4200-100, which is the digital exciter/controller for the second generation STX and STXe product lines.

The Class D Envelope Tracker 203 makes use of the Digital pulse-width modulation (PWM) generation and creates a high power analog voltage which may be 100 volts or more. This voltage is proportional to the absolute value of the input digital signal. Further, the Class D Envelope Tracker 203 is configurable to be capable of handling greater than 15 amps. The Class D Envelope Tracker 203 also provides the sign bit for each of the I/Q signals to allow the Fs/4 modulator stage—which includes a pair of Fs/4 multipliers—to switch phase for those of the inputs I or Q that would otherwise be negative.

The Fs/4 multipliers 205 may each be embodied as a single 400 MHz bandwidth RF FET transistor with the drain tied to the analog I or Q signal. The gates of the RF FET transistors are connected to a phase coherent digital pulse generator and driving a transformer in such a manner that when one gate is turned on, the current flow on the secondary is towards the antenna, and when the other gate is turned on the current flow on the secondary is away from the antenna. The sum point 207 is a wire-OR or other like type of mechanism for summing the two modulators.

Figure 3:
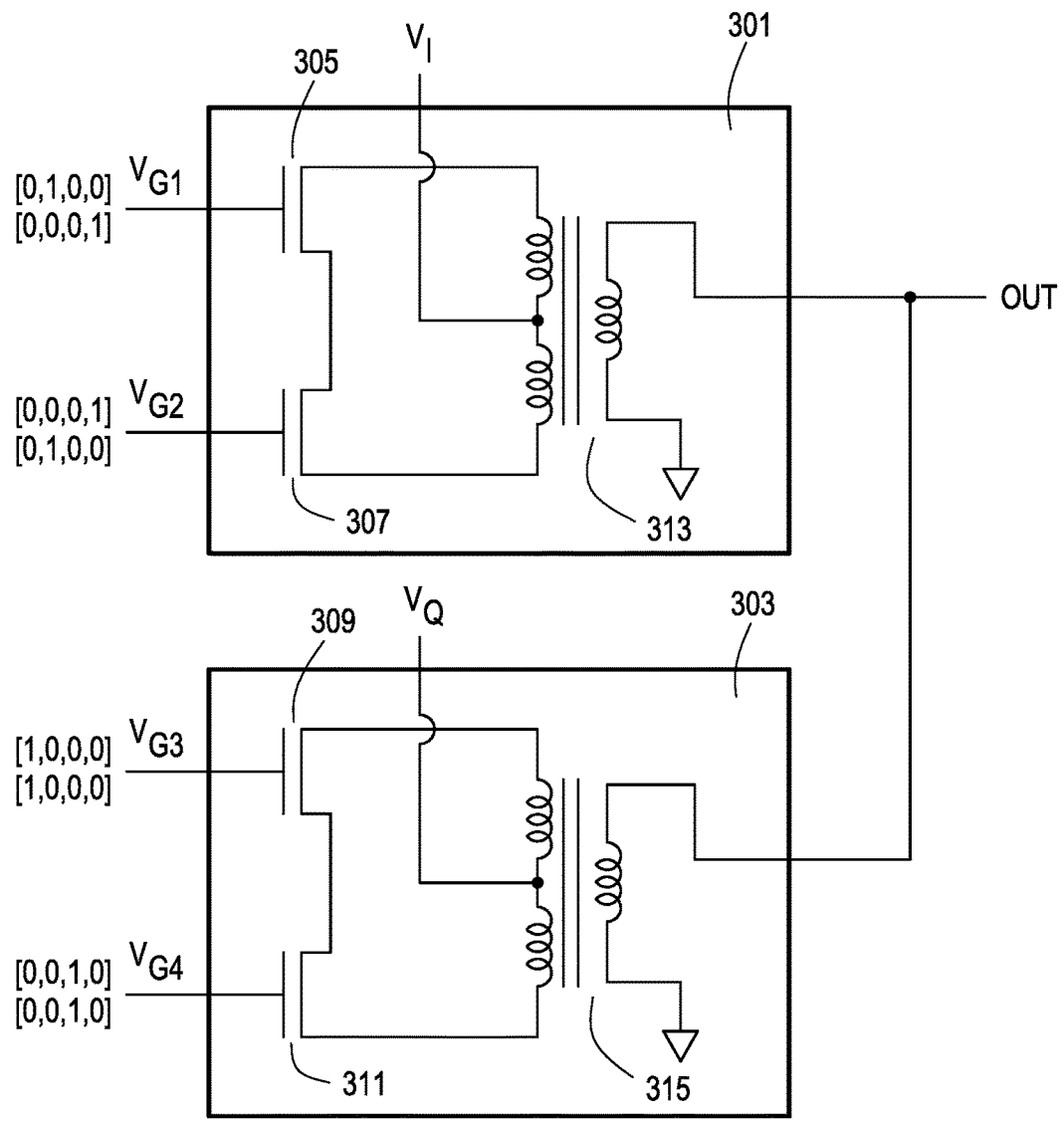
FIG. 3 depicts a circuit block diagram for a pair of Fs/4 multiplier circuits for the In-Phase and Quadrature-Phase components according to various embodiments disclosed herein.

FIG. 3 depicts an Fs/4 modulator stage 300 according to various embodiments disclosed herein. The Fs/4 multiplier stage 300 of FIG. 3 includes circuit block diagrams for a pair of Fs/4 multiplier circuits for the In-Phase and Quadrature-Phase components. The circuitry of the Fs/4 multipliers 301-301 depicted in FIG. 3 may serve as the Fs/4 multiplier circuits 205 of FIG. 2. Other implementations of the present invention may use similar circuitry, or circuitry that achieves the same logic with a power output desired for the implementation. Device 301 of FIG. 3 is the Fs/4 multiplier for the Quadrature-Phase component and device 303 is the Fs/4 multiplier for the In-Phase component. Silicon transistor devices typically lack the power throughput desired for the present embodiments. Therefore, various embodiments of the Fs/4 multipliers may utilize an LDMOS device such as the BLF188XR power transistors, or a GaN device such as the GS66516T. Other implementations of the various embodiments may use any available circuitry with sufficient power throughput. By way of illustration of the power capabilities of this new high efficiency technology, the GS66516T transistors are rated at 60 A max and 650 V max. A 3 kW FM transmitter is easily embodied, while much higher powers are also achievable using appropriately sized transistors and single- or multi-stage combining.

A number of different circuitry configurations can be used to implement the Fs/4 modulator circuit stage. The inputs to the Fs/4 modulator stage 300 are labeled with their sign bit inputs $V_{G1}$, $V_{G2}$, $V_{G3}$ and $V_{G4}$. In some embodiments two devices are utilized, as shown in FIG. 3. The first device 301 has gates $V_{G1}$ and $V_{G2}$ and the second device 303 has gates $V_{G3}$ and $V_{G4}$. Typically, the four gates are driven separately rather than differentially. The sign bit inputs $V_{G1}$, $V_{G2}$, $V_{G3}$ and $V_{G4}$ allow each of the Fs/4 multipliers 301 and 303 to switch phase during those periods that the input I or Q ($V_I$ or $V_Q$) are negative, thus producing a positive output.

Each of the four gates is typically driven at a 25% duty cycle, in sequence. To achieve this the bandwidth of the final device is twice the carrier frequency, and the switching rate is four times the carrier frequency. For instance, for a signal with a carrier frequency of 100 MHz, the output transistor will require 200 MHz bandwidth; each gate will be 'high' for 2.5 nanoseconds and 'low' for 7.5 nanoseconds. (A 200 MHz clock with a 50% duty cycle would be high for 2.5 nsec and low for 2.5 nsec.) As GaN transistors are developed, their switching frequencies tend to become higher. Currently available devices have the bandwidth required for carrier operation in the 76 MHz to 108 MHz worldwide FM band; devices under development expand that operation to above 400 MHz carrier operation.

One novel aspect of this design is that it can be implemented in a 'half bridge' rather than 'full bridge' configuration in the following manner. Since the transistors create a signal in time that is [+I, +Q, −I, −Q] repeating, the I and Q signals can be represented using positive analog voltages. That is, they do not need to represent a negative voltage. (The voltage between the Drain and the Source on the power transistor is positive.) So, in the case where the 16-bit digital I or Q signal is negative, the envelope generator creates a positive voltage equal to the absolute value of the digital signal, and will assert a 'Sign' bit to the quadrature modulator. If, for instance the I signal is negative and the Q signal is positive, the pulses to the two power transistors will now be [−I, +Q, −I, −Q]. This is accomplished with logic gates that feed the sign bits to the quadrature modulator.

Figure 4:
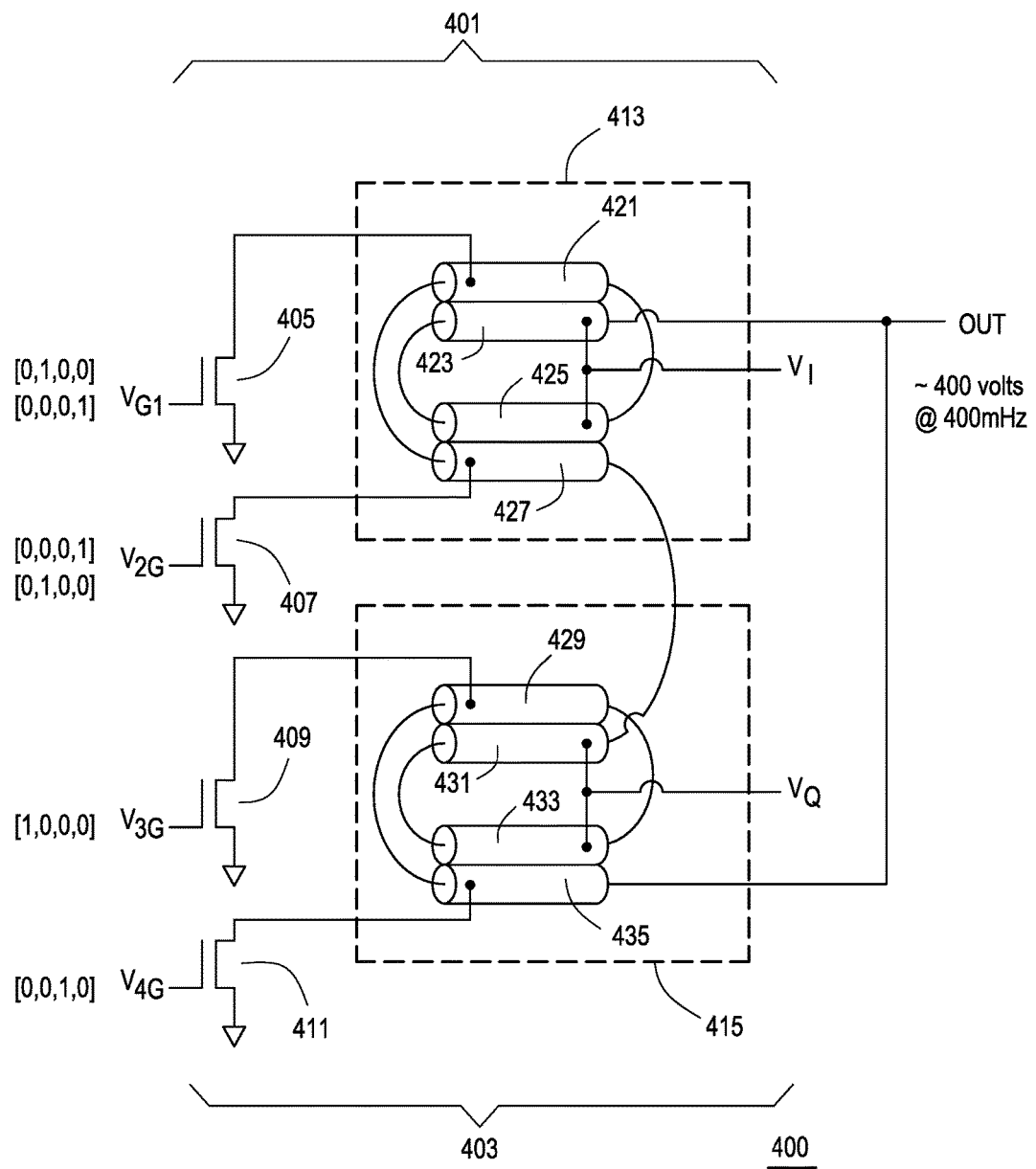
FIG. 4 depicts a circuitry implementation of the Fs/4 multiplier circuit embodiment shown in FIG. 3.

FIG. 4 depicts a circuitry implementation 400 of the Fs/4 modulator stage 300 shown in FIG. 3. The amplifier devices 405-411 may be implemented as LD MOSFET transistors (Laterally Diffused MOSFET transistors) in order to achieve a high output power. In other embodiments the amplifier devices 405-411 may be implemented as GaN devices (Gallium Nitride devices). In yet other embodiments, the amplifier devices 405-411 may be implemented as valve amplifiers or tube amplifiers. In this embodiment the transformers 313 and 315 of FIG. 3 are implemented as copper tube components 421-435. However, other high frequency transformer circuits or components may be used to implement these transformers, as are known to those of ordinary skill in the art.

The description of the various embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the intended scope of the present invention.

What is claimed is:

1. An amplifier comprising:
   a digital input/output (I/O) generator configured with an input port disposed to receive an analog input signal, and further being configured to produce a digital signal at an output port;
   an envelope tracker connected to the output port of the digital I/O generator, the envelope tracker being configured to frequency modulate the digital signal from the digital I/O generator and produce an analog in-phase (I) voltage, an analog quadrature-phase (Q) voltage, a plurality of sign bits for the I voltage, and a plurality of sign bits for the Q voltage;
   a one-quarter sample frequency (Fs/4) modulator stage comprising an Fs/4 I multiplier disposed to receive the analog I voltage and the plurality of sign bits for the I voltage and an Fs/4 Q multiplier disposed to receive the analog Q voltage and the plurality of sign bits for the Q voltage; and
   a combiner configured to sum the Fs/4 I multiplier output and the Fs/4 Q multiplier output to produce an analog output that is a high power radio frequency (RF) signal modulated by the analog input signal.

2. The amplifier of claim 1, wherein the envelope tracker is configured to produce peak voltages of at least 100 volts for the analog I voltage and the analog Q voltage.

3. The amplifier of claim 1, wherein the envelope tracker is configured to output 15 amps or more.

4. The amplifier of claim 1, wherein the digital I/O generator performs pulse-width modulation on the analog input signal to convert the analog input signal to the digital signal produced at the output port.

5. The amplifier of claim 1, wherein the Fs/4 modulator stage comprises four gates, the Fs/4 I multiplier comprising a first two gates of the four gates and the Fs/4 Q multiplier comprising a second two gates of the four gates.

6. The amplifier of claim 5, wherein said four gates of the Fs/4 modulator stage are driven at a 25% duty cycle.

7. The amplifier of claim 5, wherein said four gates are gates of four Metal-Oxide Semiconductor Field-Effect Transistor (MOSFET) transistors.

8. The amplifier of claim 5, wherein said four gates are gates of four Lateral Diffusion Metal-Oxide Semiconductor Field-Effect Transistor (LDMOSFET) transistors.

9. The amplifier of claim 5, wherein said four gates are gates of four Gallium Nitride (GaN) transistors.

10. A method of amplifying an analog input signal, the method comprising:
   configuring a digital input/output (I/O) generator to receive the analog input signal and produce a digital signal at an output port;
   connecting an envelope tracker to the output port of the digital I/O generator, the envelope tracker being configured to frequency modulate the digital signal from the digital I/O generator and produce an analog in-phase (I) voltage, an analog quadrature-phase (Q) voltage, a plurality of sign bits for the I voltage, and a plurality of sign bits for the Q voltage;
   providing a one-quarter sample frequency (Fs/4) modulator stage comprising an Fs/4 I multiplier disposed to receive the analog I voltage and the plurality of sign bits for the I voltage and an Fs/4 Q multiplier disposed to receive the analog Q voltage and the plurality of sign bits for the Q voltage; and
   combining the Fs/4 I multiplier output and the Fs/4 Q multiplier output to produce an analog output that is a high power radio frequency (RF) signal modulated by the analog input signal.

11. The method of claim 10, further comprising using an amplifier to amplify the analog input signal.

12. The method of claim 10, wherein the envelope tracker is configured to produce peak voltages of at least 100 volts for the analog I voltage and the analog Q voltage; and wherein the envelope tracker is configured to output 15 amps or more.

13. The method of claim 10, wherein the digital I/O generator performs pulse-width modulation on the analog input signal to convert the analog input signal to the digital signal produced at the output port; and
   wherein the Fs/4 modulator stage comprises four gates, the Fs/4 I multiplier comprising a first two gates of the four gates and the Fs/4 Q multiplier comprising a second two gates of the four gates.

14. The method of claim 13, wherein said four gates of the Fs/4 modulator stage are driven at a 25% duty cycle.

15. The method of claim 13, wherein said four gates are gates of four devices selected from a group consisting of Metal-Oxide Semiconductor Field-Effect Transistor (MOSFET) transistors, Lateral Diffusion Metal-Oxide Semiconductor Field-Effect Transistor (LDMOSFET) transistors and Gallium Nitride (GaN) transistors.

* * * * *